US 6,555,602 B1

(12) United States Patent
Harada et al.

(10) Patent No.: US 6,555,602 B1
(45) Date of Patent: Apr. 29, 2003

(54) COMPOSITION OF EPOXY RESIN, ANHYDRIDE AND MICROCAPSULE ACCELERATOR

(75) Inventors: Tadaaki Harada, Osaka (JP); Toshitsugu Hosokawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 45 days.

(21) Appl. No.: 09/680,531

(22) Filed: Oct. 6, 2000

(30) Foreign Application Priority Data

Oct. 6, 1999 (JP) ............................................ 11-285882
Aug. 11, 2000 (JP) ........................................ 2000-244064

(51) Int. Cl.$^7$ ............................ C08K 7/18; C08K 9/10; H01L 21/56; H01L 23/29
(52) U.S. Cl. ...................... 523/466; 257/789; 257/793; 438/127; 523/211; 525/508; 525/533
(58) Field of Search ................................. 523/211, 466; 525/508, 533; 257/789, 793; 438/127

(56) References Cited

U.S. PATENT DOCUMENTS

| | | | |
|---|---|---|---|
| 5,001,542 A | * 3/1991 | Tsukagoshi et al. | ........... 357/68 |
| 5,137,940 A | * 8/1992 | Tomiyoshi et al. | .......... 523/220 |
| 5,302,672 A | 4/1994 | Ogura et al. | ................ 525/481 |
| 5,837,771 A | 11/1998 | Wipfelder et al. | .......... 524/786 |
| 5,940,688 A | * 8/1999 | Higuchi et al. | ............. 523/443 |
| 6,054,222 A | 4/2000 | Takami et al. | .............. 523/204 |
| 6,177,489 B1 | * 1/2001 | Okuse et al. | ................ 523/451 |

FOREIGN PATENT DOCUMENTS

| | | | |
|---|---|---|---|
| EP | 0 673 957 A2 | | 9/1995 |
| JP | 4-108852 A2 | * | 4/1992 |
| JP | 7-18061 A | * | 1/1995 |
| JP | 8-109246 A2 | * | 4/1996 |
| JP | 10-139980 A | * | 5/1998 |
| JP | 11-71444 A | * | 3/1999 |
| JP | 11-147936 A | * | 6/1999 |

OTHER PUBLICATIONS

Patent Abstracts of Japan, vol. 1999, No. 05, corresponding to JP 11–029624, Feb. 2, 1999.
XP002157870 (Abstract of JP 5–065392), Mar. 19, 1993.

* cited by examiner

Primary Examiner—Robert E. L. Sellers
(74) Attorney, Agent, or Firm—Sughrue Mion, PLLC

(57) ABSTRACT

The present invention provides a resin composition for semiconductor encapsulation excellent in reliability in humidity resistance and storage stability as well as in dischargeability and coatability, a semiconductor device encapsulated with the resin composition for semiconductor encapsulation and a process for the production of the semiconductor device. The resin composition for semiconductor encapsulation comprises the following components (A) to (D) and has a viscosity of 700 Pa•s or higher at 25° C. and 500 Pa•s or lower at 80° C.:

(A) an epoxy resin;
(B) an acid anhydride-based curing agent;
(C) a latent curing accelerator; and
(D) an inorganic filler.

5 Claims, No Drawings

COMPOSITION OF EPOXY RESIN, ANHYDRIDE AND MICROCAPSULE ACCELERATOR

FIELD OF THE INVENTION

The present invention relates to an epoxy resin-based composition for semiconductor encapsulation which exhibits a low viscosity at a temperature as relatively low as 80° C. or lower and is excellent particularly in dischargeability and coatability as well as storage stability, a semiconductor device prepared by using the epoxy resin-based composition and a process for the production of the semiconductor device.

BACKGROUND OF THE INVENTION

In order to encapsulate semiconductors at TAP (Tape Automated Bonding) process, COB (Chip On Board) process, etc., a liquid encapsulating medium has heretofore been used. Such a liquid encapsulating medium is used at room temperature (25° C.). By means of a dispenser or through printing process, semiconductor elements are encapsulated with such a resinous medium to produce semiconductor devices. As such a liquid encapsulating medium there has been generally known an epoxy resin composition comprising a liquid epoxy resin, an acid anhydride-based liquid curing agent, an ordinary curing accelerator and a silica powder.

The foregoing liquid encapsulating medium comprises an acid anhydride-based curing agent as a curing agent and thus can be easily liquefied and fairly discharged and applied. However, the foregoing liquid encapsulating medium is disadvantageous in that it exhibits a high hydroscopicity under high humidity conditions and thus shows a deteriorated reliability in humidity resistance. Further, the foregoing liquid encapsulating medium normally stays liquid and thus exhibits a poor storage stability. Accordingly, the foregoing liquid encapsulating medium shows a drastic resin in viscosity or liable to sedimentation of silica powder during storage at room temperature and thus needs to be frozen to solid or otherwise stored in a special manner.

SUMMARY OF THE INVENTION

It is therefore an object of the present invention to provide a resin composition from semiconductor encapsulation which has a long pot life and is excellent not only in storage stability but in dischargeability and coatability, a semiconductor device encapsulated with the resin composition for semiconductor encapsulation and a process for the production of the semiconductor device.

The foregoing object of the invention will become apparent from the following detailed description and examples.

The foregoing object of the invention is accomplished with the first essence of the invention which lies in a resin composition for semiconductor encapsulation comprising the following components (A) to (D), having a viscosity as measured at 25° C. of 700 Pa•s or higher or being solid at 25° C. and having a viscosity as measured at 80° C. of 500 Pa•s or lower:

(A) an epoxy resin;
(B) an acid anhydride-based curing agent;
(C) a latent curing accelerator; and
(D) an inorganic filler.

The second essence of the invention lies in a semiconductor device comprising a semiconductor element provided on a wiring circuit board with a plurality of connecting electrode portions interposed therebetween, the gap between the wiring circuit board and the semiconductor element being sealed with an encapsulating resin layer, wherein the encapsulating resin layer is formed by the foregoing resin composition for semiconductor encapsulation.

The third essence of the invention lies in a process for the production of a semiconductor device comprising a semiconductor element provided on a wiring circuit board with a plurality of connecting electrode portions interposed therebetween, the gap between the wiring circuit board and the semiconductor element being sealed with an encapsulating resin layer, which comprises filling the gap between the wiring circuit board and the semiconductor element with the foregoing resin composition for semiconductor encapsulation, and then curing the resin composition to form the encapsulating resin layer.

The fourth essence of the invention lies in a semiconductor device comprising a semiconductor element provided on a wiring circuit board, the wiring circuit board and the semiconductor element being electrically connected to each other, the semiconductor element being encapsulated by an encapsulating resin layer in such an arrangement that the semiconductor element is incorporated therein, wherein the encapsulating resin layer is formed by the foregoing resin composition for semiconductor encapsulation.

The fifth essence of the invention lies in a process for the production of a semiconductor device comprising a semiconductor element provided on a wiring circuit board, the wiring circuit board and the semiconductor element being electrically connected to each other, the semiconductor element being encapsulated by an encapsulating resin layer in such an arrangement that the semiconductor element is incorporated therein, which comprises placing a semiconductor element on the wiring circuit board, electrically connecting the wiring circuit board and the semiconductor element to each other, supplying the foregoing resin composition for semiconductor encapsulation onto the wiring circuit board on the semiconductor element side thereof, and then curing the resin composition for semiconductor encapsulation to form the encapsulating resin layer.

The sixth essence of the invention lies in a semiconductor product comprising a semiconductor device having a resin encapsulation layer formed with a plurality of connecting electrode portions interposed therebetween, the semiconductor device being provided on a mounting board with the wiring circuit board of the semiconductor device being opposed to the mounting board and the gap between the mounting board and the semiconductor device being sealed with an encapsulating resin layer, wherein the encapsulating resin layer is formed by the foregoing resin composition for semiconductor encapsulation.

The seventh essence of the invention lies in a process for the production of a semiconductor device, which comprises a step of forming a resin layer made of the foregoing resin composition for semiconductor encapsulation on the protruding electrode portion side of a semiconductor wafer having a plurality of semiconductor elements with protruding electrode portions formed thereon to a predetermined thickness in such an arrangement that at least the forward end of the protruding electrode portions is exposed to the exterior of the resin layer, and a step of cutting the semiconductor wafer having a resin layer formed thereon to individual semiconductor elements.

The eighth essence of the invention lies in a process for the production of a semiconductor device, which comprises a step of supplying the resin composition for semiconductor encapsulation onto the whole of a plurality of semiconductor elements provided on a matrix wiring circuit board having individual circuits formed thereon to form a resin layer with the semiconductor elements being incorporated therein, and a step of cutting the matrix wiring circuit board having a resin layer formed thereon with the semiconductor elements being incorporated therein together with the resin layer to every semiconductor element.

The ninth essence of the invention lies in a process for the production of a semiconductor device, which comprises a step of forming a resin layer made of the foregoing resin composition for semiconductor encapsulation on the protruding electrode portion side of a semiconductor wafer having a plurality of semiconductor elements with protruding electrode portions formed thereon to a predetermined thickness, a step of cutting the semiconductor wafer having a resin layer formed thereon to individual semiconductor elements, and a step of contact-bonding a wiring circuit board and the semiconductor element thus cut under heating with the resin layer side of the semiconductor element and the wiring circuit board being opposed to each other so that the two components are electrically connected to each other and the resin layer is melted and cured to form an encapsulating resin layer between the semiconductor element and the wiring circuit board, thereby encapsulating the semiconductor element.

The tenth essence of the invention lies in a process for the production of a semiconductor device, which comprises a step of applying the foregoing resin composition for semiconductor encapsulation to a matrix wiring circuit board having individual circuits formed thereon to form a resin layer thereon, a step of cutting the wiring circuit board having a resin layer formed thereon to individual wiring circuit boards, and a step of contact-bonding semiconductor elements each having a plurality of connecting electrode portions provided thereon and the wiring circuit boards thus cut with the connecting electrode portion side of the semiconductor elements and the wiring circuit boards being opposed to each other so that the two components are electrically connected to each other and the resin layer is melted and cured to form an encapsulating resin layer between the semiconductor elements and the wiring circuit boards, thereby encapsulating the semiconductor elements.

The inventors made extensive studies of an encapsulating material which has a long pot life and is excellent not only in storage stability but in dischargeability and coatability. As a result, it was found that the desired object of the invention can be accomplished by the use of a resin composition comprising an epoxy resin, an acid anhydride-based curing agent, a latent curing accelerator and an inorganic filler and having a predetermined state and viscosity at each of temperatures of 25° C. and 80° C. Thus, the present invention has been worked out.

In particular, use of a polyfunctional epoxy resin as the epoxy resin is advantageous in that the composition gives a cured resin having an elevated glass transition temperature ($T_g$) and enhanced heat resistance.

A resin composition for semiconductor encapsulation comprising as the latent curing accelerator a microcapsule type curing accelerator having a core-shell structure in which a core portion made of the curing accelerator is covered by a specific shell portion is advantageous in that it exhibits an extremely prolonged pot life and thus is particularly excellent in storage stability.

Further, a resin composition for semiconductor encapsulation comprising as the inorganic filler a spherical fused silica powder incorporated therein in a specific proportion is advantageous in that it exhibits an excellent fluidity and thus is particularly excellent in dischargeability and coatability.

DETAILED DESCRIPTION OF THE INVENTION

Embodiments of implication of the present invention will be described hereinafter in detail.

The resin composition for semiconductor encapsulation of the invention comprises an epoxy resin (component A), an acid anhydride-based curing agent (component B), a latent curing accelerator (component C) and an inorganic filler (component D) and exhibits a specific state and viscosity at each temperature of 25° C. and 80° C.

The foregoing epoxy resin (component A) is not specifically limited. Various epoxy resins can be used. Examples of the solid epoxy resin employable herein include polyfunctional solid epoxy resin, crystalline epoxy resin, bifunctional solid epoxy resin, triglycidyl isocyanurate, bisphenol F type epoxy resin, and bisphenol A type epoxy resin. These solid epoxy resins may be used singly or in combination of two or more thereof. The term "polyfunctional solid epoxy resin" as used herein is meant to indicate a solid epoxy resin having three or more epoxy groups per molecule. Examples of the polyfunctional solid epoxy resin employable herein include tetrafunctional naphthalene type epoxy resin, triphenylmethane type epoxy resin, dicyclopentadiene type epoxy resin, Techmore VG3101L (produced by MITSUI CHEMICAL CORPORATION), and orthocresol novolak type epoxy resin. The term "crystalline epoxy resin" as used herein is meant to indicate a solid epoxy resin which shows many crystalline peaks when subjected to X-ray diffractometry, physically shows a sharp melting point and exhibits a drastically lowered viscosity during melting because there is little or no intermolecular mutual interaction. Examples of the crystalline epoxy resin employable herein include bisphenol type epoxy resin, biphenyl type epoxy resin, and stilbene type epoxy resin. When those having a melting point of 90° C. or higher among these crystalline epoxy resins are used, two or more of these crystalline epoxy resins are preferably used for the reason that the resulting fluidity at a temperature of 80° C. or lower is improved.

Among the foregoing epoxy resins (component A), the crystalline epoxy resin may be, e.g., Type GK-4137 epoxy resin (commercially available from NIPPON STEEL CORP.), Type GK-5079 (commercially available from NIPPON STEEL CORP.), and Type YDC-1312 (commercially available from Tohto Kasei Corp.). Type GK-4137 epoxy resin is represented by the following chemical formula (2). Type GK-5079 epoxy resin is represented by the following chemical formula (3). Type YDC-1312 epoxy resin is represented by the following chemical formula (4).

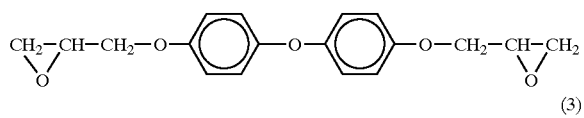

(2)

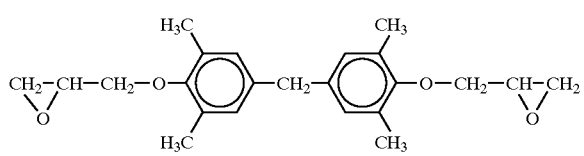

(3)

-continued

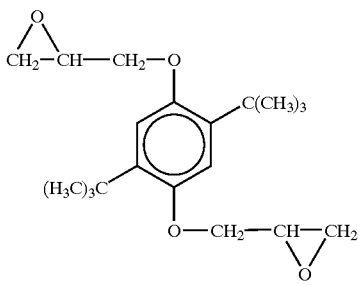

(4)

Among the foregoing crystalline epoxy resins, the biphenyl type epoxy resin is represented by the following general formula (5):

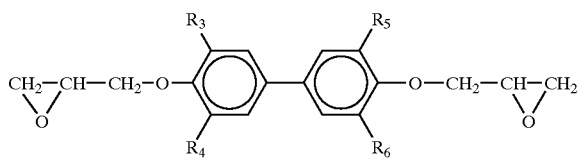

(5)

wherein $R_3$ to $R_6$ may be the same or different and each represent a hydrogen atom or $C_{1-5}$ alkyl group.

Examples of the $C_{1-5}$ alkyl group represented by $R_3$ to $R_6$ in the foregoing general formula (5) include straight-chain or branched lower alkyl group such as methyl group, ethyl group, n-propyl group, isopropyl group, n-butyl group, isobutyl group, sec-butyl group and tert-butyl group. $R_3$ to $R_6$ may be the same or different.

As the foregoing biphenyl type epoxy resin there can be used a mixture of a biphenyl type epoxy resin having a structure represented by the following general formula (6) wherein all $R_3$ to $R_6$ are methyl group and a biphenyl type epoxy resin having a structure represented by the following general formula (7) wherein all $R_3$ to $R_6$ are hydrogen atom in almost the same amount:

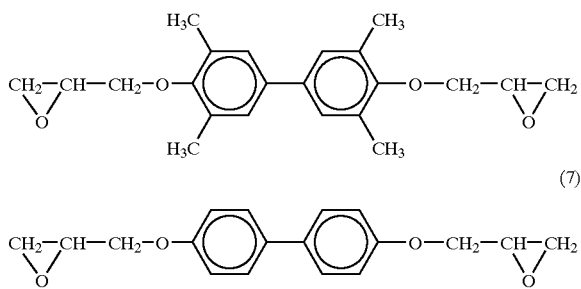

(6)

(7)

The foregoing epoxy resin to be used as component A preferably has an epoxy equivalent of from 140 to 270 g/eq and a softening point of from 50° C. to 100° C. or a melting point of from 40° C. to 150° C., particularly an epoxy equivalent of from 150 to 220 g/eq and a softening point of from 60° C. to 80° C. or a melting point of from 60° C. to 130° C.

The acid anhydride-based curing agent (component B) to be used in combination with the component A is not specifically limited so far as it acts as a curing agent for the epoxy resin (component A). Various acid anhydrides can be used. An acid anhydride may be used in combination with any of various phenolic resins, amines, phthalic acids, and the like so far as the use of such an optional curing ingredient does not defeat the desired object of the invention. Examples of the acid anhydride-based curing agent (component B) include hexahydrophthalic anhydride, methylhexahydrophthalic anhydride, tetrahydrophthalic anhydride, phthalic anhydride, and trimetallitic anhydride. These acid anhydrides may be used singly or in combination of two or more thereof.

The acid anhydride to be used as the component B preferably has an equivalent of from 100 to 200, and is more preferably one which has an equivalent of from 150 to 180 and is liquid at ordinary temperature.

The epoxy resin (component A) and the acid anhydride-based curing agent (component B) are mixed together in such a proportion that the amount of the curing agent is preferably from 0.6 to 1.4 equivalents, more preferably from 0.7 to 1.1 equivalent, to the epoxy resin.

A preferred combination of the epoxy resin (component A) and the acid anhydride-based curing agent (component B) comprises, for example, a bisphenol F type epoxy resin [particularly trade name YDF-8170 (produced by Tohto Kasei Co., Ltd.)] and methylhexahydrophthalic anhydride [methylated HHPA (e.g., Rikacid MH-700, produced by Shin Nihon Rika K.K.)] from the standpoints of curability, heat resistance, and flowability.

When incorporated together with the components A and B in the resin composition for semiconductor encapsulation, the foregoing latent curing accelerator (component C) acts to cause the resin composition to show a viscosity increase of 10 times or less after 72 hours of aging in a 50° C. atmosphere (viscosity measured at 80° C.). An example of the latent curing accelerator is a microcapsule type curing accelerator having a core-shell structure in which a core portion made of one or more selected from various curing accelerators is covered by a shell portion comprising as a main component a polymer having a structural unit represented by the following general formula (1) wherein the reactive amino group present in the shell portion is blocked. The resin composition for semiconductor encapsulation comprising such a microcapsule type curing accelerator incorporated therein exhibits extremely prolonged pot life and thus is excellent particularly in storage stability. Even when the use of an ordinary curing accelerator in a small amount causes the resin composition to show a viscosity increase of 10 times or less, normally 1 to 3 times, the curing accelerator is regarded as a latent curing accelerator.

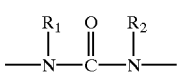

(1)

wherein $R_1$ and $R_2$, which may be the same or different, each represents a hydrogen atom or a monovalent organic group.

The curing accelerator to be encapsulated as a core portion in the foregoing microcapsule type curing accelerator is not specifically limited so far as it acts to accelerate curing reaction. Known curing accelerators can be used. Those which stay liquid at room temperature are suitable from the standpoint of workability in microencapsulation or the characteristics of the resulting microcapsules. The term "liquid at room temperature" as used herein is meant to indicate that the curing accelerator stays liquid at room temperature (25° C.) itself or the curing accelerator stays solid at room temperature but can be liquefied by dissolving or dispersing in an arbitrary organic solvent.

Examples of the curing accelerator to be encapsulated include amine-based curing accelerator, imidazole-based curing accelerator, phosphorus-based curing accelerator, and phosphorus-boron-based curing accelerator. Specific examples of these curing accelerators include imidazole derivatives such as 2-methylimidazole, 2-ethylimidazole, 2-ethyl-4-methylimidazole, 2-isopropylimidazole, 2-dodecylimidazole, 2-undecylimidazole, 2-heptadecylimidazole, 2-phenylimidazole, 1-benzyl-2-methylimidazole, 1-benzyl-2-phenylimidazole, and 1-cyanoethyl-2-methylimidazole, alkyl-substituted guanidines such as ethylguanidine, trimethylguanidine, phenylguanine and diphenylguanidine, 3-substituted phenyl-1,1-dimethylureas such as 3-(3,4-dichlorophenyl)-1,1-dimethylurea, 3-phenyl-1,1-dimethylurea and 3-(4-chlorophenyl)-1,1-dimethylurea, 3-phenyl-1,1-dimethylurea and 3-(4-chlorophenyl)-1,1-dimethylurea, imidazolines such as 2-methylimidazoline, 2-phenylimidazoline, 2-undecylimidazoline and 2-heptadecylimidazoline, monoaminopyridines such as 2-aminopyridine, amineimides such as N,N-dimethyl-N-(2-hydroxy-3-allyloxypropyl) amine-N'-lactamide, organic phosphorus-based compounds such as ethylphosphine, propylphosphine, butylphosphine, phenylphosphine, trimethylphosphine, triethylphosphine, tributylphosphine, trioctylphosphine, triphenylphosphine, tricyclohexylphosphine, triphenylphosphine/triphenylborane complex and tetraphenylphosphonium tetraphenylborate, diazabicycloalkenes such as 1,8-diazabicyclo[5,4,0]undecene-7, and 1,4-diazabicyclo[2,2,2]octane. These curing accelerators may be used singly or in combination of two or more thereof. Preferred among these curing accelerators are imidazole-based compounds and organic phosphorus-based compounds from the standpoint of ease in production of curing accelerator-containing microcapsules and handling.

The polymer comprising as a main component a polymer having a structural unit represented by the foregoing general formula (1) can be obtained by the polyaddition reaction of polyisocyanates with polyvalent amines or the reaction of polyisocyanates with water.

As the foregoing polyvalent isocyanates there can be used any compounds having two or more isocyanate groups per molecule. Specific examples of these polyvalent isocyanates include diisocyanates such as m-phenylenediisocyanate, p-phenylenediisocyanate, 2,4-tolylenediisocyanate, 2,6-tolylenediisocyanate, naphthalene-1,4-diisocyanate, diphenylmethane-4,4'-diisocyanate, 3,3'-dimethoxy-4,4'-biphenyldiisocyanate, 3,3'-dimethyldiphenylmethne-4,4'-diisocyanate, xylylene-1,4-diisocyanate, 4,4'-diphenylpropanediisocyanate, trimethylenediisocyanate, hexamethylenediisocyanate, propylene-1,2-diisocyanate, butylene-1,2-diisocyanate, cyclohexylene-1,2-diisocyanate and cyclohexylene-1,4-diisocyanate, triisocyanates such as p-phenylenediisothiocyanate, xylylene-1,4-diisothiocyanate and ethylidinediisothiocyanate, tetraisocyanates such as 4,4'-dimethyldiphenylmethane-2,2',5,5'-tetraisocyanate, adduct of hexamethylenediisocyanate with hexanetriol, adduct of 2,4-tolylenediisocyanate with Brenzcatechol, adduct of tolylenediisocyanate with hexanetriol, adduct of tolyenediisocyanate with trimethylolpropane, adduct of xylylenediisocyanate with trimethylolpropane, adduct of hexamethylenediisocyanate with trimethylolpropane, and isocyanate prepolymers such as trimer of aliphatic polyvalent isocyanate such as triphenyldimethylenetriisocyanate, tetraphenyltrimethylene tetraisocyanate, pentaphenyltetramethylene pentaisocyanate, lysine isocyanate and hexamethylene diisocyanate. These compounds may be used singly or in combination of two or more thereof.

Preferred among the foregoing polyvalent isocyanates from the standpoints of film-forming properties in microencapsulation and mechanical strength is at least one trivalent isocyanate prepolymer selected from (X) an adduct of tolylene diisocyanate with trimethylolpropane and (Y) an adduct of xylylene diisocyanate with trimethylolpropane. Furthermore, triphenyldimethylene triisocyanate also can be used as a preferred polyvalent isocyanate.

On the other hand, as the polyvalent amines to be reacted with the polyvalent isocyanates there can be used any compounds having two or more amino groups per molecule. Specific examples of these compounds employable herein include diethylenetriamine, triethylenetetramine, tetraethylene pentamine, 1,6-hexamethylenediamine, 1,8-octamethylene diamine, 1,12-dodecamethylenediamine, o-phenylenediamine, m-phenylenediamine, p-phenylenediamine, o-xylylenediamine, m-xylylenediamine, p-xylylenediamine, menthanediamine, bis(4-amino-3-methylcyclohexyl)methane, isophoronediamine, 1,3-diaminocyclohexane, and spiroacetal-based diamine. These compounds may be used singly or in combination of two or more thereof.

The reaction of the polyvalent isocyanates with water causes hydrolyzation of the polyvalent isocyanates resulting in the production of an amine that is then reacted with unreacted isocyanate groups (so-called self-polyaddition reaction) is produce a polymer comprising as a main component a polymer having a structural unit represented by the general formula (1).

As the polymer constituting the shell portion (wall membrane) there may be used a polyurethane-polyurea having a urethane bond in common with each other produced from the polyvalent isocyanate and a polyvalent alcohol in combination.

As the foregoing polyvalent alcohol there can be used any of aliphatic alcohol, aromatic alcohol and alicyclic alcohol. Examples of the polyvalent alcohol employable herein include catechol, resorcinol, 1,2-dihydroxy-4-methylbenzene, 1,3-dihdyroxy-5-methylbenzene, 3,4-dihdyroxy-1-methylbenzene, 3,5-dihydroxy-1-methylbenzene, 2,4-dihydroxyethylbenzene, 1,3-naphthalenediol, 1,5-naphthalenediol, 2,7-naphthalenediol, 2,3-naphthalenediol, o,o'-biphenol, p,p'-biphenol, bisphenol A, bis-(2-hydroxyphenyl)methane, xylylenediol, ethylene glycol, 1,3-propylene glycol, 1,4-butylene glycol, 1,5-pentanediol, 1,6-hexanediol, 1,7-heptanediol, 1,8-octanediol, 1,1,1-trimethylolpropane, hexanetriol, pentaerythritol, glycerin, and sorbitol. These compounds may be used singly or in combination of two or more thereof.

The foregoing microcapsule type curing accelerator can be prepared through, e.g., the following three steps.

[1st step]

The curing accelerator as a core component is dissolved of finely dispersed in a polyvalent isocyanate as a raw material of wall (shell) to form an oil phase. Subsequently, the oil phase thus formed is dispersed in the aqueous medium (aqueous phase) containing a dispersion stabilizer in the form of oil drop to prepared an O/W (oil phase/aqueous phase) emulsion. Subsequently, in the O/W emulsion was dissolved a polyvalent amine to cause interfacial polymerization of the polyvalent amine with the polyvalent isocyanate in the oil phase to initiate polyaddition reaction. Alternatively, the O/W emulsion is heated so that the polyvalent isocyanate in the oil phase reacts with water at the interface with the aqueous phase to produce an amine that subsequently initiate self-polyaddition reaction. Thus, microcapsules comprising as a shell portion (wall membrane) a polyurea-based polymer, preferably a polyurea having a structural unit represented by the general formula (1) are prepared to obtain a microcapsule dispersion.

On the other hand, when a solid curing accelerator is dissolved in an organic solvent to form a core component, an S/O/W (solid phase/oil phase/aqueous phase) emulsion is obtained. In this type of an emulsion, the curing accelerator is lipophilic. A hydrophilic curing accelerator can be difficultly formed into this type of an emulsion. In this case, however, the solubility of the curing accelerator can be properly adjusted to form an O/O (oil phase/oil phase) emulsion or S/O/O (solid phase/oil phase/oil phase) emulsion which then undergoes interfacial polymerization.

The organic solvent for dissolving the curing accelerator therein is not specifically limited so far as it stays liquid at room temperature. In practice, however, one which does not dissolve the shell portion (wall membrane) therein needs to be selected. Specific examples of the organic solvent employable herein include organic solvents such as ethyl acetate, methyl ethyl ketone, acetone, methylene chloride, xylene, toluene and tetrahydrofuran, and oils such as phenylxylylethane and dialkylnaophthalene.

[2nd step]

In the microcapsule dispersion obtained at the 1st step is then dissolved or dispersed a blocking agent. In this procedure, the addition of the blocking agent can be effected after the removal of the dispersion stabilizer or unreacted amine from the aqueous phase by centrifugal separation or the like to advantage.

[3rd step]

The microcapsule dispersion which has been subjected to blocking of amino group with a blocking agent at the 2nd step can be subjected to centrifugal separation, filtration or the like to remove excessive blocking agent, and then dried to prepare a powdered microcapsule type curing accelerator.

Examples of the dispersion stabilizer to be added to the aqueous medium (aqueous phase) at the 1st step include water-soluble high molecular compounds such as polyvinyl alcohol and hydroxymethyl cellulose, and surface active agents such as anionic surface active agent, nonionic surface active agent and cationic surface active agent. Alternatively, hydrophilic inorganic colloidal materials such as colloidal silica and viscous mineral may be used. The amount of such a dispersion stabilizer to be added is preferably predetermined to be from 0.1 to 10% by weight based on the weight of the aqueous phase.

The blocking agent to be used at the 2nd step is not specifically limited so far as it is a compound reactive with amino group. Examples of such a compound employable herein include compounds which react with amino group to form a covalent bond such as epoxy compound, aldehyde compound, acid anhydride, ester compound and isocyanate. Further examples of such a compound include acidic compounds which undergo neutralization reaction with amino group to form a salt such as organic carboxylic acids (e.g., acetic acid, formic acid, lactic acid, oxalic acid and succinic acid, organic sulfonic acids such as p-toluenesulfonic acid, 2-naphthalenesulfonic acid and dodecylbenzenesulfonic acid), phenol compounds, inorganic acids such as boric acid, phosphoric acid, nitric acid, nitrous acid and hydrochloric acid, and solid materials having an acidic surface (e.g., silica, aerogil). Preferred among these compounds are the acidic compounds, which can be used to effectively block the amino group present on and inside the wall membrane. Particularly preferred among these acidic compounds are formic acid and organic sulfonic acids.

The foregoing blocking agent is added in an amount equimolar with the amino group present on and inside the wall membrane. In practical, when as the blocking agent there is used as acidic compound, the acidic material (acidic compound) is added to the dispersion which has just been subjected to microcapsulization (interfacial polymerization) so that the pH value of the dispersion is adjusted from basicity to acidity, preferably a pH of 2 to 5. Thereafter, the dispersion may be subjected to centrifugal separation, filtration or the like to remove excessive acidic compound.

In the process for the production of a microcapsule type curing accelerator comprising the foregoing 1st to 3rd steps, the 2nd step may also involve the passing of the microcapsule dispersion through an acidic cation exchange column by which the unreacted free amine can be removed or the remaining amino group can be neutralized.

The average particle diameter of the microcapsule type curing accelerator thus obtained is not specifically limited. In practice, however, it is preferably predetermined to a range of from 0.05 to 500 $\mu$m, more preferably from 0.1 to 30 $\mu$m from the standpoint of uniformity in dispersion. The shape of the microcapsule type curing accelerator is preferably sphere but may be epplipsoid. In the case where the microcapsules are not uniform in particle diameter, e.g., where the microcapsules are ellipsoidal or flat rather than spherical, the value obtained by simply averaging the longest diameter and the shortest diameter is defined as average particle diameter.

The amount of the curing accelerator to be encapsulated in the microcapsule type curing accelerator is preferably predetermined to be from 10 to 95% by weight, particularly from 30 to 80% by weight based on the total amount of microcapsules. In other words, when the amount of the curing accelerator to be encapsulated falls below 10% by weight, the curing reaction time is too long to give sufficient reactivity. On the contrary, when the amount of the curing accelerator to be encapsulated exceeds 95% by weight, the thickness of the resulting wall membrane is too small to provide the core portion (curing agent) with sufficient isolatability and mechanical strength.

The ratio of the thickness of the shell portion (wall membrane) to the particle diameter of the microcapsule type curing accelerator is preferably predetermined to a range of from 3 to 25%, particularly from 5 to 25%. In other words, when the foregoing ratio falls below 3%, the resulting microcapsules cannot be provided with a sufficient mechanical strength against the shear developed at the kneading step during the production of epoxy resin composition. On the contrary, when the foregoing ratio exceeds 25%, there is a tendency that the curing accelerator encapsulated is insufficiently released.

The amount of the latent curing accelerator (component C) to be incorporated is preferably from 0.1 to 40 parts by weight (hereinafter abbreviated as "parts"), more preferably from 5 to 20 parts, per 100 parts of the acid anhydride-based curing agent (component B). This is because when the amount of the latent curing accelerator incorporated is smaller than 0.1 part, the composition has too low a curing rate, leading to reduced strength, and because amounts thereof exceeding 40 parts result in too high a curing rate and this may impair flowability.

The amount of the latent curing accelerator (component C) to be incorporated is preferably predetermined to a range of from 0.1 to 40 parts by weight (hereinafter abbreviated as "parts"), particularly from 5 to 20 parts based 100 parts of the above acid anhydride-based curing agent (component B). In other words, when the amount of the latent curing accelerator to be incorporated falls below 0.1 parts, the curing rate is so low that the resulting strength is liable to be lowered. On the contrary, when the amount of the latent curing accelerator to be incorporated exceeds 40 parts, the curing rate is so high that the fluidity is liable to be impaired.

In the invention, as the latent curing accelerator to be used as component C there may be used a commercially available microcapsule type curing accelerator besides the curing accelerator-containing microcapsules so far as the desired object cannot be impaired. Examples of these commercially available microcapsule type curing accelerators include MCE-9957 (comprising as wall membrane methyl methacrylate; produced by NIPPON KAYAKU CO., LTD.), and Novacure produced by Asahi Ciba Co., Ltd. (HX-3748, 3741, 3742, HX-3921HR, HX-3941HP). Even curing accelerators other than microcapsule type curing accelerator may be used such as those having a reduced catalytic activity such as dicyan diamide and Fujicure FXR-1030 and FXE-1000 produced by Fuji Chemical Industry Corp. or if they are ordinary curing accelerators and added in a small amount to give a reduced catalyst activity.

The inorganic filler (component D) to be used as the components A to C is not specifically limited. Various inorganic fillers may be used. Examples of these inorganic fillers include silica, clay, gypsum, calcium carbonate, barium sulfate, alumina, beryllium oxide, silicon carbide, silicon nitride, and aerogil. These compounds may comprise an electrically-conductive particulate material such as nickel, gold, copper, silver, tin, lead and Bi incorporated therein. Preferred among these compounds is spherical silica powder, particularly spherical fused silica powder. The average particle diameter of the inorganic filter is preferably from 0.01 to 60 μm, more preferably from 0.1 to 15 μm. The term "spherical" as used herein is meant to indicate that the sphericity is 0.85 or more on the average as measured by a Type FPIA-100 flow type particle image analyzer (produced by SYSMEX INC.).

The content of the inorganic filler (component D) is preferably from 50 to 92% by weight, more preferably from 60 to 88% by weight, based on the whole resin composition for semiconductor encapsulation. This is because when the content of the inorganic filler is lower than 50% by weight, the composition gives a cured resin having an increased coefficient of linear expansion and tending to have a stress, and because when the content thereof exceeds 92% by weight, the composition tends to have reduced flowability and show impaired dischargeability and applicability.

Further, the resin composition for semiconductor encapsulation of the invention may comprise other additives incorporated therein besides the components A to D if necessary.

Examples of the other additives employable herein include fire retardant, wax, alcohols such as ethyl alcohol and methyl alcohol, glycols such as polypropylene glycol, polyethylene glycol, and glycerol, leveling agent, antifoaming agent, flux, pigment dye, silane coupling agent, and titanate-based coupling agent. Examples of the silane coupling agent employable herein include γ-mercaptopropyl trimethoxysilane, γ-glycidoxypropyl methyl diethoxysilane, β-(3,4-epoxycyclohexyl)ethyltrimethoxysilane, γ-methacryloxypropyl trimethoxysilane, and amino group-containing silane. These silane coupling agents may be used singly or in combination of two or more thereof.

Examples of the first retardant employable herein include novolak type brominated epoxy resin, and brominated bisphenol A type epoxy resin, metallic compounds such as antimony trioxide, antimony pentaoxide, magnesium hydroxide and aluminum hydroxide, and phosphorus-based compounds such as red phosphorus and ester phosphate. These fire retardants may be used singly or in combination of two or more thereof.

Also usable besides those fire retardants is a polyhedral metal hydroxide represented by the following general formula (8). This metal hydroxide has a polyhedral crystal form, and differs from conventional metal hydroxides having a hexagonal platy crystal form or having a thin platy crystal form, like flaky ones. Specifically, the polyhedral crystal form is obtained from a metal hydroxide having a high crystal growth rate not only in the length and width directions but in the thickness direction (c-axis direction), e.g., one having a platy crystal form, by causing the crystals to grow in the thickness direction (c-axis direction) into particulate crystals which are more three-dimensional and nearly spherical. For example, the metal hydroxide has a crystal form which is nearly dodecahedral, nearly octahedral, nearly tetrahedral, etc.

$$M_{l-x}Q_x(OH)_2 \tag{8}$$

In formula (8), M is at least one metal atom selected from Mg, Ca, Sn, and Ti; Q is at least one metal atom selected from Mn, Fe, Co, Ni, Cu, and Zn; and x is a positive number of from 0.01 to 0.5.

A metal hydroxide having such a polyhedral crystal form can be obtained, for example, by regulating various conditions in a metal hydroxide production process so as to grow crystals not only in the length and width directions but in the thickness direction (c-axis direction). Thus, a metal hydroxide having the desired polyhedral crystal form, e.g., a nearly dodecahedral, nearly octahedral, or nearly tetrahedral form, can be obtained. Usually, the metal hydroxide is a mixture of particles having such crystal forms.

Typical examples of the metal hydroxide having a polyhedral crystal form include $Mg_{l-x}Ni_x(OH)_2[0.01<x<0.5]$ and $Mg_{l-x}Zn_x(OH)_2[0.01<x<0.5]$. Examples of commercial products of these metal hydroxides include Echomag, produced by Tateho Chemical Industries Co., Ltd.

The metal hydroxide having a polyhedral crystal form has an aspect ratio of generally from 1 to 8, preferably from 1 to 7, more preferably from 1 to 4. The term "aspect ratio" herein means the ratio of the length of the major axis of the metal hydroxide to that of the minor axis thereof. When the aspect ratio thereof exceeds 8, the epoxy resin composition containing this metal hydroxide is reduced in the effect of having a low viscosity upon melting.

Examples of the wax employable herein include a higher fatty acid, a higher fatty acid ester, a higher fatty acid calcium, and an amide-based compound. These waxes may be used singly or in combination of two or more thereof.

The resin composition for semiconductor encapsulation of the invention may comprise a silicone oil, silicone rubber, synthetic rubber or reactive diluent incorporated therein besides the above-described other additives to reduce the resulting stress. The resin composition for semiconductor encapsulation of the invention may comprise an ion trap agent such as hydrotalcite and bismuth hydroxide for the purpose of enhancing the reliability in the humidity resistance reliability test.

The resin composition for semiconductor encapsulation of the invention can be prepared, e.g., in the following manner. In some detail, the foregoing components A to D and optionally other additives are mixed, and then kneaded under heating in a kneader such as universal agitator so that it is melt-mixed. Subsequently, the mixture is cooled to room temperature (approx. 25° C.) to produce the desired resin composition for semiconductor encapsulation. In order to adjust the fluidity of the resin composition for semiconductor encapsulation, an organic solvent may be added. Examples of the organic solvent employable herein include toluene, xylene, methyl ethyl ketone (MEK), acetone, and diacetone alcohol. These organic solvents may be used singly or in combination of two or more thereof.

The resin composition for semiconductor encapsulation thus obtained must be solid at 25° C. or have a viscosity as measured at 25° C. of 700 Pa•s or higher and must have a viscosity as measured at 80° C. of 500 Pa•s or lower. Especially preferably, the resin composition is solid at 25° C. or has a viscosity as measured at 25° C. of 700 Pa•s or higher, and has a viscosity as measured at 80° C. of 300 pa•s or lower. In other words, when the viscosity of the resin composition for semiconductor encapsulation falls below 700 Pa•s at 25° C., the resulting resin composition exhibits deteriorated storage stability, when the viscosity of the resin composition for semiconductor encapsulation exceed 500 Pa•s at 80° C., the resulting resin composition exhibits deteriorated dischargeability and coatability, and thus, in both cases the resulting resin composition cannot satisfy the desired initial requirements.

The viscosity of the resin composition for semiconductor encapsulation at 25° C. and 80° C. can be measured by an E type viscometer as follows.

[Viscosity at 25° C.]

For the measurement of viscosity, a Type RE80U viscometer comprising a cone rotor having a size of 3° and R7.7 produced by Toki Sangyo Co., Ltd. was used. The sample was pretreated at a cone rotor rotary speed of 1 rpm for 1 minutes at 25° C., and then allowed to stand at 0.1 rpm for 10 minutes at 25° C. before measurement.

[Viscosity at 80° C.]

For the measurement of viscosity, a Type RE80R viscometer produced by Toki Sangyo Co., Ltd. was used. For the sample having a viscosity of less than 100 Pa•s, a cone rotor having a size of 3°×R14 was used. For the sample having a viscosity of 100 Pa•s or more, a cone rotor having a size of 3°×R7.7 was used. The sample was pretreated at a cone rotor rotary speed of 1 rpm for 1 minute at 80° C., and then allowed to stand at 0.5 rpm for 10 minutes at 80° C. before measurement.

The production of a semiconductor device from the resin composition for semiconductor encapsulation of the invention is accomplished by various known methods. In mounting by flip chip, COB, grabtop, cavity fill, etc., the resin composition for semiconductor encapsulation which has been heated (to a temperature of from about 40° C. to 90° C., preferably from about 60° C. to 80° C.) is supplied by means of a dispenser so that the semiconductor element is potted. The resin composition is then heated and cured to form an encapsulating resin layer. Thus, a semiconductor device can be produced. Alternatively, a solid or semi-solid resin composition for semiconductor encapsulation may be directly adhered or applied to the semiconductor element, etc., and then heated and cured to form an encapsulating resin layer. Thus, a semiconductor device can be produced. The mounting may be effected in vacuo.

Among the foregoing processes for the production of a semiconductor device, flip chip mounting will be further described hereinafter with reference to side fill encapsulation process, press bump encapsulation process and printing encapsulation process.

[Side fill encapsulation process]

A wiring circuit board having semiconductor elements provided thereon with a plurality of connecting electrode portions interposed therebetween is prepared. The gap between the wiring circuit board and semiconductor elements which have been previously heated (to a temperature of from about 40° C. to 130° C., preferably from 60° C. to 100° C.) is then filled with the resin composition for semiconductor encapsulation which has been heated (to a temperature of from about 40° C. to 90° C., preferably from about 60° C. to 80° C.) and injected by means of a dispenser. The resin composition thus injected is then heated and cured to form an encapsulating resin layer. In this manner, a semiconductor device can be produced by flip chip mounting.

Alternatively, a solid or semi-solid resin composition for semiconductor encapsulation which has not previously been heated may be directly applied onto the semiconductor elements or to the area in the vicinity thereof, and then heated and cured to form an encapsulating resin layer in the gap between the semiconductor elements and the wiring circuit board.

The production of a semiconductor by side fill encapsulation process may be effected in vacuo. As the apparatus for the production of such a semiconductor device in vacuo there may be used a Type MBC-V Series produced by Musashi Engineering Co., Ltd. The foregoing production of a semiconductor device in vacuo may be accomplished by differential pressure filling method which comprises filling of the gap between the wiring circuit board and the semiconductor elements in vacuo with the resin composition for semiconductor encapsulation which has been injected by means of a dispenser and subsequent filling the gap with the resin composition at atmospheric pressure.

[Press bump encapsulation process]

The resin composition for semiconductor encapsulation which has been heated (to a temperature of from about 40° C. to 90° C., preferably from 60° C. to 80° C.) is applied onto the wiring circuit board by means of a dispenser so that the semiconductor elements are potted. Thereafter, press bump connection process using a flip chip bonder or the like is effected to carry out the electrical connection between the semiconductor elements and the wiring circuit board and the formation of an encapsulating resin layer at the same time. In this manner, a semiconductor device can be produced by flip chip mounting.

Alternatively, a solid or semi-solid resin composition for semiconductor encapsulation which has not previously been heated may be directly applied to the semiconductor elements or wiring circuit board, followed by press bump connection process. In this manner, the connection between the semiconductor elements and the wiring circuit board and the formation of an encapsulating resin layer can be effected at the same time.

The production of a semiconductor device by press bump encapsulation process may be effected in vacuo.

Instead of potting by means of a dispenser, printing may be effected to apply the resin composition if possible, followed by press bump connection process by flip chip bonder or the like which effects the electrical connection between the semiconductor elements and the wiring circuit board and the formation of an encapsulating resin layer at the same time. In the application by printing, the printing atmosphere may be entirely heated or the mask or squeegee may be partly heated (to a temperature of from about 40° C. to 100° C.).

[Printing encapsulation process]

A wiring circuit board having semiconductor elements provided thereon with a plurality of connecting electrode portions interposed therebetween is prepared. The resin composition for semiconductor encapsulation which has been heated (to a temperature of from about 40° C. to 90° C., preferably from about 60° C. to 80° C.) is then dropped into the gap between the wiring circuit board and semiconductor elements which has previously been heated (to a temperature of from about 40° C. to 130° C., preferably from about 60° C. to 100° C.) by means of a dispenser so that printing encapsulation is effected to form an encapsulating resin layer. In this manner, a semiconductor device can be produced by flip chip mounting.

The printing encapsulation process is preferably accomplished by the use of a Type VPE-100 Series vacuum printing encapsulation apparatus using vacuum differential pressure (produced by Toray Engineering Co., Ltd.) because air bubbles can hardly enter into the encapsulating resin layer.

Alternatively, a solid or semi-solid resin composition for semiconductor encapsulation which has not previously been heated may be directly applied to a stage or squeegee so that printing encapsulation can be effected.

On the other hand, among the foregoing processes for the production of a semiconductor device, the cavity fill process for the production of a semiconductor device will be further described hereinafter.

A wiring circuit board having semiconductor elements provided thereon in such an arrangement that the semiconductor elements are electrically connected thereto through a bonding wire or the like is prepared. The resin composition for semiconductor encapsulation which has been heated (to a temperature of from about 40° C. to 90° C., preferably from about 60° C. to 80° C.) is then applied to the wiring circuit board and semiconductor elements which has previously been heated (to a temperature of from about 40° C. to 130° C., preferably from about 60° C. to 100° C.) by means of a dispenser so that the semiconductor elements are potted. The resin composition is then heated and cured so that an encapsulating resin layer is formed to encapsulate the semiconductor elements. In this manner, a cavity fill type of semiconductor device can be produced.

Alternatively, a solid or semi-solid resin composition for semiconductor encapsulation which has not previously been heated may be directly adhered or applied to the semiconductor elements, and then heated and cured to form an encapsulating resin layer in such an arrangement that the semiconductor elements are encapsulated.

The production of a semiconductor device by the foregoing encapsulation method may be effected in vacuo. As the apparatus for the production of such a semiconductor device in vacuo there may be used a Type MBC-V Series produced by Musashi Engineering Co., Ltd.

Other processes for the production of a semiconductor device will be further described hereinafter. A wiring circuit board having semiconductor elements provided thereon in such an arrangement that the semiconductor elements are electrically connected thereto through a bonding wire or the like is prepared. The resin composition for semiconductor encapsulation which has been heated (to a temperature of from about 40° C. to 90° C., preferably from about 60° C. to 80° C.) is then supplied on the wiring circuit board and semiconductor elements which have previously been heated (to a temperature of from about 40° C. to 130° C., preferably from 60° C. to 100° C.) by printing or the like, and then heated and cured to form an encapsulating resin layer in such an arrangement that the semiconductor elements are encapsulated. In this manner, a cavity fill type of semiconductor device can be produced.

The production of a semiconductor device by printing encapsulation process may be effected in vacuo. In the procedure of producing a semiconductor device in vacuo, printing encapsulation in vacuo may be followed by the rise in the atmospheric pressure that causes the removal of voids from the resin composition for semiconductor encapsulation. Finish printing may be then effected under these conditions.

The semiconductor device is then placed on a mounting board (mother board) to produce a semiconductor product. In some detail, the semiconductor device is mounted on the mounting board (mother board) with a plurality of connecting electrode portions being provided interposed therebetween. At the same time, the gap between the mounting board and the semiconductor device is filled with the resin composition for semiconductor encapsulation of the invention which is then heated and cured to form an encapsulating resin layer. In this manner, a semiconductor product is produced.

The method for heating and curing the resin composition for semiconductor encapsulation is not specifically limited. In practice, however, a heating method using a convection dryer, IR reflow furnace, hot plate or the like can be used.

Examples of the method for filling the gap between the mounting board and the semiconductor device with the resin composition for semiconductor encapsulation of the invention include the same methods as described with flip chip mounting among the processes for the production of a semiconductor device mentioned above, i.e., side fill encapsulation process, press bump encapsulation process, printing encapsulation process, etc. The resin composition for semiconductor encapsulation may comprise an electrically=conductive particulate material such as nickel, gold, silver, copper, tin, lead and Bismuth dispersed therein to form ACT (Anisotropic Conductive Film) or ACP (Anisotropic Conductive Paste) which is then used for flip chip mounting. In other embodiments, the resin composition for semiconductor encapsulation may be applied to the wiring circuit board as a damming material or may be used as an adhesive for bonding the wiring circuit board to the heat radiator or a die-bonding agent.

The production of a semiconductor device comprising the resin composition for semiconductor encapsulation of the invention which has been provided on a semiconductor wafer or matrix wiring circuit board can be accomplished by various known methods.

The production of a semiconductor device will be described with reference to the case where the resin composition for semiconductor encapsulation of the invention is applied to a semiconductor wafer having a plurality of semiconductor elements with protruding electrode portions formed thereon. In some detail, the resin composition for semiconductor encapsulation which has been heated (to a temperature of from about 40° C. to 90° C., preferably from about 60° C. to 80° C.) is applied to the protruding electrode portion side of the semiconductor wafer by means of a dispenser to form a resin layer made of the resin composition for semiconductor encapsulation to a predetermined thickness. The formation of a resin layer made of the resin composition for semiconductor encapsulation to a predetermined thickness is effected in such a manner that at least the forward end of the protruding electrode portion is exposed to the exterior of the resin layer. Subsequently, the semiconductor wafer having a resin layer formed thereon is cut to produce a semiconductor device.

The formation of a resin layer made of the resin composition for semiconductor encapsulation can be carried out by printing through an opening in the mask.

The resin layer thus formed may be in any state so far as it is eventually thermoset. The heating and curing of the resin layer may be effected before or after cutting of the semiconductor wafer.

On the other hand, the resin composition for semiconductor encapsulation is supplied onto the whole of a plurality of semiconductor elements mounted on a matrix wiring circuit board having individual wiring circuits formed thereon to form a resin layer in such an arrangement that the semiconductor elements are encapsulated. Subsequently, the resin layer is thermoset to encapsulate the plurality of semiconductor elements with the resin composition. The plurality of semiconductor element to produce semiconductor devices.

The resin layer thus formed may be in any state so far as it is eventually thermoset. The heating and curing of the resin layer may be effected before or after cutting of the semiconductor elements.

As the method for forming the resin layer made of the resin composition for semiconductor encapsulation there may be used a method using a dispenser, a method involving printing through an opening in the mask or the like similarly to the method previously mentioned.

Alternatively, the resin composition for semiconductor encapsulation is supplied onto the protruding electrode portion side of a semiconductor wafer having a plurality of semiconductor elements with protruding electrode portions formed thereon to form a resin layer to a predetermined thickness. The semiconductor wafer having a resin layer formed thereon is then cut to individual semiconductor elements. Subsequently, the wiring circuit board and the semiconductor elements are contact-bonded to each other under heating with the resin layer side of the semiconductor elements thus separated and the plurality of wiring circuit boards being opposed to each other so that they are electrically connected to each other. At the same time, the resin layer is melted and cured to form an encapsulated resin layer between the semiconductor elements and the wiring circuit boards so that the semiconductor elements are encapsulated. In this manner, a semiconductor device is produced.

Alternatively, the resin composition for semiconductor encapsulation is supplied onto a matrix wiring circuit board having individual wiring circuits formed thereon to form a resin layer. The wiring circuit board having a resin layer formed thereon is then cut to individual wiring circuit boards. Subsequently, semiconductor elements each provided with a plurality of connecting electrode portions and the wiring circuit boards thus separated are contact-bonded to each other under heating with the connecting electrode portion side of the semiconductor elements and the wiring circuit boards being opposed to each other so that they are electrically connected to each other. At the same time, the resin layer is melted and cured to form an encapsulating resin layer between the semiconductor elements and the wiring circuit boards so that the semiconductor elements are encapsulated. In this manner, a semiconductor device is produced.

As the method for forming the resin layer made of the resin composition for semiconductor encapsulation there may be used a method using a dispenser, a method involving printing through an opening in the mask or the like similarly to the method previously mentioned.

The present invention will be further described in the following examples and comparative examples, but the present invention should not be construed as being limited thereto.

The following ingredients were prepared prior to these Examples.

[Epoxy resin a1]
Crystalline epoxy resin represented by the following chemical formula (2) (GK-4137, produced by Nippon Steel Chemical Co., Ltd.; epoxy equivalent, 174 g/eq; melting point, 70° C.).

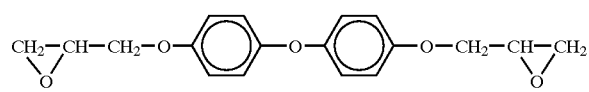

(2)

[Epoxy resin a2]
Bisphenol F type epoxy resin (Epo Tohto YDF-8170, produced by Tohto Kasei Co., Ltd.,; liquid at 25° C.; epoxy equivalent, 158 g/eq).

[Epoxy resin a3]
Bisphenol A type epoxy resin (Epikote 1001W, produced by Yuka Shell Co., Ltd.; solid at 25° C.; epoxy equivalent, 405 g/eq).

[Epoxy resin a4]
Crystalline epoxy resin represented by the following chemical formula (3) (GK-5079, produced by Nippon Steel Chemical Co., Ltd.; epoxy equivalent, 190 g/eq; melting point, 78° C.).

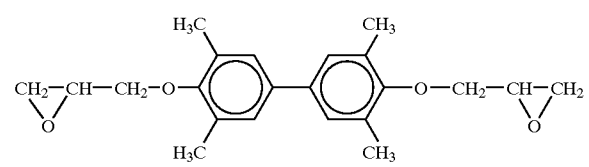

(3)

[Acid anhydride]
Methylhexahydrophthalic anhydride (methylated HHPA, Rikacid MH-700, produced by New Japan Chemical Co., Ltd.)

[Curing accelerator c1]
A microcapsule type curing accelerator was prepared in accordance with the method previously mentioned. In some detail, 11 parts of an adduct of 3 mols of xylylene diisocyanate and 1 mol of trimethylolpropane and 4.6 parts of an adduct of 3 mols of tolylene diisocyanate and 1 mol of trimethylolpropane were uniformly dissolved in a mixture of 7 parts of triphenyl phosphine and 3.9 parts of ethyl acetate as curing accelerators to prepare an oil phase. Separately, an aqueous phase comprising 100 parts of distilled water and 5 parts of a polyvinyl alcohol was prepared. To the aqueous phase thus prepared was then added the oil phase prepared as above. The mixture was then subjected to emulsification by means of a homomixer to form an emulsion. The emulsion thus formed was then charged into a polymerization reactor equipped with a reflux tube, an agitator and a dropping funnel.

On the other hand, 10 parts of an aqueous solution containing 3 parts of triethylenetetramine were prepared. The aqueous solution thus prepared was then put into the dropping funnel provided in the foregoing polymerization reactor. The aqueous solution was dropped into the emulsion in the reactor where interfacial polymerization took place at a temperature of 70° C. for 3 hours to obtain an aqueous suspension of microcapsule type curing accelerator. Subsequently, the aqueous suspension was subjected to centrifugal separation to remove the polyvinyl alcohol, etc.

from the aqueous phase. To the residue were then added 100 parts of distilled water. The mixture was then subjected to dispersion to obtain a suspension.

To the suspension was then added formic acid to adjust the pH value of the system to 3. In this manner, a microcapsule type curing accelerator in which the amino group present on and inside the wall membrane had been blocked with formic acid was prepared. The microcapsule type curing accelerator thus obtained was repeatedly subjected to centrifugal separation and rinsing, and then dried to isolate the microcapsule type curing accelerator as a free-flowing powder. The average particle diameter of the microcapsule type curing accelerator was 2 μm. The ratio of the shell thickness to the particle diameter of microcapsules was 15%. The encapsulated amount of triphenylphosphine was 30% by weight based on the total amount of the microcapsule type curing accelerator.

[Curing accelerator c2]

MCE-9957 produced by NIPPON KAYAKU CO., LTD.

[Curing accelerator c3]

2-Ethyl-4-methylimidazole (Curezol 2E4MZ, produced by Shikoku Chemicals Corp.)

[Inorganic filler d1]

Spherical fused silica powder (SE-2100, produced by Admatechs Co., Ltd.; average particle diameter: 0.56μm)

[Inorganic filler d2]

Spherical fused silica powder (FB-48X, produced by DENKI KAGAKU KOGYO K.K.; average particle diameter: 15 μm)

EXAMPLES 1 to 4 AND COMPARATIVE EXAMPLE

The ingredients shown above were mixed according to each of the formulations given in Table 1 below. The resultant mixtures each was kneaded and melt-mixed by means of a universal agitator and then cooled to room temperature to prepare desired resin compositions for semiconductor encapsulation. The kneading conditions were as follows. The epoxy resin and the acid anhydride were first charged into the agitator and mixed together at 100° C. for 20 minutes. Thereafter, the temperature of the mixture was lowered to 80° C., and the inorganic filler was added thereto. The resultant mixture was stirred for 20 minutes and then cooled to 70° C. Thereto was added the curing accelerator. This mixture was homogenized by stirring for 2 minutes.

TABLE 1

| | | Unit: parts | | | | |
|---|---|---|---|---|---|---|
| | | Example | | | | Comparative |
| | | 1 | 2 | 3 | 4 | Example |
| Epoxy resin | a1 | — | — | 50 | — | — |
| | a2 | 58.2 | — | — | 58.2 | 290 |
| | a3 | — | 100 | — | — | — |
| | a4 | — | — | 50 | — | — |
| Acid anhydride | | 61.8 | 37.3 | 92.5 | 61.8 | 308 |
| Curing accelerator | c1 | 7.2 | 4.4 | 10.8 | — | — |
| | c2 | — | — | — | 11.0 | — |
| | c3 | — | — | — | — | 7.7 |
| Inorganic filler | d1 | 138 | 33.7 | 126 | 138 | 87.2 |
| | d2 | 742 | 181 | 674 | 742 | 463 |
| Content of inorganic filler in total amount (wt %) | | 88 | 60 | 80 | 88 | 48 |

The resin compositions for semiconductor encapsulation of examples and comparative examples thus obtained were each measured for viscosity at 25° C. and 80° C. by means of an E type viscometer in accordance with the foregoing methods. These resin compositions for semiconductor encapsulation were each then measured and evaluated for glass transition temperature (Tg), storage stability (degree of sedimentation of inorganic filler, degree of change of viscosity), dischargeability, coatability and pot life in accordance with the following methods. The semiconductor devices produced from the foregoing resin compositions for semiconductor encapsulation were then measured and evaluated for reliability in humidity resistance in accordance with the following method. The results are set forth in Table 2 below.

[Glass transition temperature (Tg)]

A test piece obtained by curing the resin composition for semiconductor encapsulation, which had previously been deformed, at a temperature of 150° C. for 3 hours was measured for glass transition temperature by means of TMA apparatus (model #MG8000GM) produced by Rigaku Corp. The measurement was effected at a temperature rising rate of 5° C./min under a load of 30 g. The measurements were then plotted with elongation as ordinate and temperature as abscissa to make a graph. The point of intersection of the tangential line between 50° C. and 70° C. and the tangential line between 200° C. and 230° C. was defined as Tg.

[Storage stability]

*1: Degree of sedimentation of inorganic filler

Into a test tube having an inner diameter of 16 mmφ and a height of 180 mm was put the resin composition for semiconductor encapsulation to a height of 120 nm. The test tube was then capped. The test specimen was allowed to stand at a temperature of 25° C. for 30 days, and then confirmed for the degree of sedimentation of inorganic filler. In order to judge if sedimentation takes place or not, the change in turbidity was visually confirmed by making the use of the fact that where the inorganic filler is sedimented, the level of turbidity of the resin composition for semiconductor encapsulation changes. When the turbidity decreases (transparency increases), it is defined that sedimentation takes place. In some detail, when the height of the sedimented portion is 1 mm or more, it is defined that sedimentation takes place. This state is represented by the mark X. When there is no sedimented portion, it is defined that no sedimentation takes place. This state is represented by the mark ⓞ.

*2: Degree of viscosity change

The resin composition for semiconductor encapsulation was allowed to stand in a 25° C. atmosphere for 30 days. The sample was measured for viscosity before and after aging by means of an E type viscometer (measuring temperature: 80° C. (25° C. for conventional example). When the viscosity after aging is 1.5 times or less that before aging, it is judged as ⓞ. When the viscosity after aging is from more than 1.5 times to 3.0 times or less that before aging, it is judged as ○. When the viscosity after aging is from more than 3.0 times to 10 times or less that before aging, it is judged as Δ. When the viscosity after aging is more than 10 times that before aging, it is judged as X. The measurement of viscosity by means of an E type viscometer was effected in the same manner as the measurement of viscosity at 25° C. or 80° C.

[Dischargeability, coatability]

For the evaluation of dischargeability, the amount of the resin composition for semiconductor encapsulation discharged through a dispenser under specific time and pressure conditions was determined. In some detail, using a 10 cc syringe produced by Musashi Engineering Co., Ltd. and a Type SN-17G metallic needle (inner diameter: 2.4 mm), the discharged amount of the resin composition was measured after 10 seconds at a pressure of $49.05 \times 10^4$ N/m². When the discharged amount is 1,000 mg or more, it is defined as ⊙. When the discharged amount is from 200 mg or more to less than 1,000 mg or more, it is defined as ○. When the discharged amount is from 50 mg or more to less than 200 mg or more, it is defined as Δ. When the discharge amount is less than 50 mg, it is defined as X. When the discharged amount is less than 50 mg, the level of encapsulation of semiconductor with resin is unacceptable.

[Pot life (viscosity change)]

The various resin compositions for semiconductor encapsulation were each measured for viscosity before and after aging at a temperature of 50° C. for 72 hours by means of an E type viscometer (measuring temperature: 80° C. (25° C. for conventional example)). When the viscosity after aging is 1.5 times or less that before aging, it is defined as ⊙. When the viscosity after aging is from more than 1.5 times to 3.0 times or less that before aging, it is defined as ○. When the viscosity after aging is from more than 3.0 times to 10 times or less that before aging, it is defined as Δ. When the viscosity after aging is more than 10 times that before aging, it is defined as X. The measurement of viscosity by means of an E type viscometer was effected in the same manner as the measurement of viscosity at 25° C. or 80° C.

TABLE 2

|  |  | Example | | | | Comparative |
|---|---|---|---|---|---|---|
|  |  | 1 | 2 | 3 | 4 | Example |
| Viscosity | 25° C. | solid | solid | solid | solid | 60 |
| (Pa · s) | 80° C. | 10 | 12 | 95 | 13 | 1 |
| Glass transition temp. (° C.) |  | 141 | 130 | 150 | 139 | 140 |
| Storage stability | *1 | ⊙ | ⊙ | ⊙ | ○ | x |
|  | *2 | ⊙ | ○ | ⊙ | ○ | x |
| Dischargeability, applicability |  | ⊙ | ⊙ | Δ | ⊙ | ⊙ |
| Pot life |  | ⊙ | ⊙ | ⊙ | ○ | Δ |

*1 Degree of sedimentation of inorganic filler
*2 Degree of viscosity change

The results given in Table 2 show the following. All the compositions of the Examples showed no sedimentation of inorganic filler and had a prolonged pot life and excellent storage stability as compared with the composition of the Comparative Example. The compositions according to the invention further had excellent dischargeability and applicability. Furthermore, the compositions of Examples 1 to 3 had a far longer pot life and exceedingly high storage stability as compared with epoxy resin compositions for semiconductor encapsulation containing a commercially available microcapsule type curing accelerator, because they contained a specific microcapsule type curing accelerator as a latent curing accelerator.

In contrast, the composition of the Comparative Example showed impaired storage stability and had a shortened pot life because the curing accelerator used therein was not a latent curing accelerator.

The present invention will be further described in the following examples of process for the production of the foregoing semiconductor devices.

EXAMPLE 5

The resin composition for semiconductor encapsulation prepared in Example 1 was previously defoamed at a temperature of 70° C. in vacuo. A semiconductor device was then produced from the resin composition thus defoamed as follows. In some detail, a wiring circuit board having semiconductor elements mounted thereon wherein the two components are electrically connected to each other with a bonding wire was prepared. The resin composition for semiconductor encapsulation which had been heated to a temperature of 70° C. was then applied to the wiring circuit board and semiconductor elements which had previously been heated to a temperature of 70° C. at a pressure of 0.67 kPa by printing through an opening in the mask. Subsequently, the pressure of the atmosphere was raised to 20 kPa to remove voids contained in the resin composition for semiconductor encapsulation thus applied. The resin composition for semiconductor encapsulation which had been heated to a temperature of 70° C. was then used to finish printing with the pressure of the atmosphere being kept to 20 kPa. Thereafter, the resin composition for semiconductor encapsulation was thermoset at a temperature of 120° C. for 16 hours to form an encapsulating resin layer in such an arrangement that the semiconductor elements are encapsulated. In this manner, a cavity fill type of semiconductor device was produced.

EXAMPLE 6

The resin composition for semiconductor encapsulation prepared in Example 1 was previously defoamed at a temperature of 70° C. in vacuo. The resin composition thus defoamed was then used to produce a semiconductor device. In some detail, the resin composition for semiconductor encapsulation which had been heated to a temperature of 70° C. was applied to a wiring circuit board which had previously been heated to a temperature of 100° C. through a dispenser so that the wiring circuit board was potted. Thereafter, using a flip chip bonder, semiconductor elements (size: 9.5 mm×9.5 mm) were placed on the wiring circuit board, the semiconductor elements and the wiring circuit board were then electrically connected to each other with connecting electrode portions under hot pressing conditions (140° C.×20N×60 min.+220° C.×5N×2 min.), and at the same time, an encapsulating resin layer was formed in the gap between the wiring circuit board and the semiconductor elements. In this manner, a semiconductor was produced by flip chip mounting.

EXAMPLE 7

The resin composition for semiconductor encapsulation prepared in Example 1 was previously defoamed at 70° C. in vacuo. Using this resin composition, a semiconductor device was produced in the following manner. A wiring circuit board having semiconductor elements mounted thereon with connecting electrode portions interposed therebetween was prepared. Subsequently, the gap between the wiring circuit board and semiconductor elements which had been heated to 100° C. was filled by means of a dispenser with the resin composition for semiconductor encapsulation heated to 70° C. Thereafter, the resin composition applied was cured by heating at 120° C. for 16 hours to form an encapsulating resin layer in the gap between the wiring circuit board and the semiconductor elements. Thus, a semiconductor device was produced by flip chip mounting.

EXAMPLE 8

The resin composition for semiconductor encapsulation prepared in Example 1 was previously defoamed at 70° C. in vacuo. Using this resin composition, a semiconductor device was produced in the following manner. A wiring circuit board having semiconductor elements mounted thereon with connecting electrode portions interposed therebetween was prepared. Subsequently, the gap between the wiring circuit board and semiconductor elements which had been heated to 70° C. was filled with the resin composition for semiconductor encapsulation heated to 70° C., by means of a dispenser in a vacuum of 0.67 kPa. Thereafter, the resin composition applied was cured by heating at 120° C. for 16 hours to form an encapsulating resin layer in the gap between the wiring circuit board and the semiconductor elements. Thus, a semiconductor device was produced by flip chip mounting.

EXAMPLE 9

The resin composition for semiconductor encapsulation prepared in Example 1 was previously defoamed at 70° C. in vacuo. Using this resin composition, a semiconductor device was produced in the following manner. A wiring circuit board having semiconductor elements mounted thereon with connecting electrode portions interposed therebetween was prepared. Subsequently, the gap between the wiring circuit board and semiconductor elements which had been heated to 70° C. was filled with the resin composition for semiconductor encapsulation heated to 70° C., by means of a dispenser in a vacuum of 0.67 kPa. Thereafter, the ambient pressure was returned to atmospheric pressure and the gap was further filled with the resin composition for semiconductor encapsulation heated to 70° C. (differential pressure filling). The resin composition thus applied was cured by heating at 120° C. for 16 hours to form an encapsulating resin layer in the gap between the wiring circuit board and the semiconductor elements. Thus, a semiconductor device was produced by flip chip mounting.

EXAMPLE 10

The resin composition for semiconductor encapsulation prepared in Example 1 was previously defoamed at 70° C. in vacuo. Using this resin composition, a semiconductor device was produced in the following manner. A wiring circuit board which had been heated to 100° C. was potted by applying thereto with a dispenser the resin composition for semiconductor encapsulation heated to 70° C. Thereafter, using a flip chip bonder, semiconductor elements were placed on the wiring circuit board and electrically connected thereto with connecting electrode portions by thermocompression bonding (conditions: 140° C.×20N×60 min+200° C.×5N×2 min). By this treatment, an encapsulating resin layer was simultaneously formed in the gap between the wiring circuit board and the semiconductor elements. Thus, a semiconductor device was produced by flip chip mounting.

EXAMPLE 11

The resin composition for semiconductor encapsulation prepared in Example 1 was previously defoamed at 70° C. in vacuo. Using this resin composition, a semiconductor device was produced in the following manner. Semiconductor elements which had been heated to 100° C. were potted by applying thereto with a dispenser the resin composition for semiconductor encapsulation heated to 70° C. Thereafter, using a flip chip bonder, a wiring circuit board heated to 70° C. was placed on the semiconductor elements and electrically connected thereto with connecting electrode portions by thermocomposition bonding (conditions: 140° C.×20 N×60 min+220° C.×5 N×2 min). By this treatment, an encapsulating resin layer was simultaneously formed in the gap between the wiring circuit board and the semiconductor elements. Thus, a semiconductor device was produced by flip chip mounting.

EXAMPLE 12

The resin composition for semiconductor encapsulation prepared in Example 1 was previously defoamed at 70° C. in vacuo. Using this resin composition, a semiconductor device was produced in the following manner. A wiring circuit board which has been heated to 70° C. was potted by applying thereto with a dispenser in a vacuum of 0.67 kPa the resin composition for semiconductor encapsulation heated to 70° C. Thereafter, using a flip chip bonder, semiconductor elements were placed on the wiring circuit board and electrically connected thereto with connecting electrode portions by thermocompression bonding (conditions: 140° C.×20 N×60 min+220° C.×5 N×2 min). By this treatment, an encapsulating resin layer was simultaneously formed in the gap between the wiring circuit board and the semiconductor elements. Thus, a semiconductor device was produced by flip chip mounting.

EXAMPLE 13

The resin composition for semiconductor encapsulation prepared in Example 1 was previously defoamed at 70° C. in vacuo. Using this resin composition, a semiconductor device was produced in the following manner. Semiconductor elements which had been heated to 70° C. were potted by applying thereto with a dispenser in a vacuum of 0.67 kPa the resin composition for semiconductor encapsulation heated to 70° C. Thereafter, using a flip chip bonder, a wiring circuit board heated to 70° C. was placed on the semiconductor elements and electrically connected thereto with connecting electrode portions by thermocompression bonding (conditions: 140° C.×20 N×60 min+220° C.×5 N×2 min). By this treatment, an encapsulating resin layer was simultaneously formed in the gap between the wiring circuit board and the semiconductor elements. Thus, a semiconductor device was produced by flip chip mounting.

EXAMPLE 14

The resin composition for semiconductor encapsulation prepared in Example 1 was previously defoamed at 70° C. in vacuo. Using this resin composition, a semiconductor device was produced in the following manner. The resin composition for semiconductor encapsulation heated to 70° C. was applied to semiconductor elements which has been heated to 70° C., by printing through openings formed in a mask. Thereafter, using a flip chip bonder, a wiring circuit board heated to 70° C. was placed on the semiconductor elements and electrically connected thereto with connecting electrode portions by thermocompression bonding (conditions: 140° C.×20 N×60 min+220° C.×5 N×2 min). By this treatment, an encapsulating resin layer was simultaneously formed in the gap between the wiring circuit board and the semiconductor elements. Thus, a semiconductor device was produced by flip chip mounting.

EXAMPLE 15

The resin composition for semiconductor encapsulation prepared in Example 1 was previously defoamed at 70° C. in vacuo. Using this resin composition, a semiconductor device was produced in the following manner. The resin composition for semiconductor encapsulation heated to 70° C. was applied to a wiring circuit board which has been heated to 70° C., by printing through openings formed in a mask. Thereafter, using a flip chip bonder, semiconductor elements were placed on the wiring circuit board and electrically connected thereto with connecting electrode portions by thermocompression bonding (conditions: 140° C.×20 N×60 min+220° C.×5 N×2 min). By this treatment, an encapsulating resin layer was simultaneously formed in the gap between the wiring circuit board and the semiconductor elements. Thus, a semiconductor device was produced by flip chip mounting.

EXAMPLE 16

The resin composition for semiconductor encapsulation prepared in Example 1 was previously defoamed at 70° C. in vacuo. Using this resin composition, a semiconductor device was produced in the following manner. The resin composition for semiconductor encapsulation heated to 70° C. was applied to semiconductor elements which has been heated to 70° C., in a vacuum of 0.67 kPa by printing through openings formed in a mask. Thereafter, using a flip chip bonder, a wiring circuit board heated to 70° C. was placed on the semiconductor elements and electrically connected thereto with connecting electrode portions by thermocompression bonding (conditions: 140° C.×20 N×60 min+220° C.×5 N×2 min). By this treatment, an encapsulating resin layer was simultaneously formed in the gap between the wiring circuit board and the semiconductor elements. Thus, a semiconductor device was produced by flip chip mounting.

EXAMPLE 17

The resin composition for semiconductor encapsulation prepared in Example 1 was previously defoamed at 70° C. in vacuo. Using this resin composition, a semiconductor device was produced in the following manner. The resin composition for semiconductor encapsulation heated to 70° C. was applied to a wiring circuit board which has been heated to 70° C., in a vacuum of 0.67 kPa by printing through openings formed in a mask. Thereafter, using a flip chip bonder, semiconductor elements (size: 9.5 mm×9.5 mm) were placed on the wiring circuit board and electrically connected thereto with connecting electrode portions by thermocompression bonding (conditions: 140° C.×20 N×60 min+220° C.×5 N×2 min). By this treatment, an encapsulating resin layer was simultaneously formed in the gap between the wiring circuit board and the semiconductor elements. Thus, a semiconductor device was produced by flip chip mounting.

EXAMPLE 18

The resin composition for semiconductor encapsulation prepared in Example 1 was previously defoamed at 70° C. in vacuo. Using this resin composition, a semiconductor device was produced in the following manner. A wiring circuit board having semiconductor elements mounted thereon was prepared in which the elements were electrically connected to the circuit board with bonding wires. The semiconductor elements which had been heated to 100° C. were potted by applying thereto with a dispenser the resin composition for semiconductor encapsulation heated to 70° C. Thereafter, the resin composition applied was cured by heating at 120° C. for 16 hours to form an encapsulating resin layer in which the semiconductor elements were encapsulated. Thus, a cavity fill type semiconductor device was produced.

EXAMPLE 19

The resin composition for semiconductor encapsulation prepared in Example 1 was previously defoamed at 70° C. in vacuo. Using this resin composition, a semiconductor device was produced in the following manner. A wiring circuit board having semiconductor elements mounted thereon was prepared in which the elements were electrically connected to the circuit board with bonding wires. The semiconductor element which had been heated to 70° C. were potted by applying thereto with a dispenser in a vacuum of 0.67 kPa the resin composition for semiconductor encapsulation heated to 70° C. Thereafter, the resin composition applied was cured by heating at 120° C. for 16 hours to form an encapsulating resin layer in which the semiconductor elements were encapsulated. Thus, a cavity fill type semiconductor device was produced.

EXAMPLE 20

The resin composition for semiconductor encapsulation prepared in Example 1 was previously defoamed at 70° C. in vacuo. Using this resin composition, a semiconductor device was produced in the following manner. A wiring circuit board having semiconductor elements mounted thereon was prepared in which the elements were electrically connected to the circuit board with bonding wires. The resin composition for semiconductor encapsulation heated to 70° C. was applied to the semiconductor elements which had been heated to 70° C., by printing through openings formed in a mask. Thereafter, the resin composition applied was cured by heating at 120° C. for 16 hours to form an encapsulating resin layer in which the semiconductor elements were encapsulated. Thus, a cavity fill type semiconductor device was produced.

EXAMPLE 21

The resin composition for semiconductor encapsulation prepared in Example 1 was previously defoamed at 70° C. in vacuo. Using this resin composition, a semiconductor device was produced in the following manner. A wiring circuit board having semiconductor elements mounted thereon was prepared in which the elements were electrically connected to the circuit board with bonding wires. The resin composition for semiconductor encapsulation heated to 70° C. was applied to the semiconductor elements which had been heated to 70° C., in a vacuum of 0.67 kPa by printing through openings formed in a mask. Thereafter, the resin composition applied was cured by heating at 120° C. for 16 hours to form an encapsulating resin layer in which the semiconductor elements were encapsulated. Thus, a cavity fill type semiconductor device was produced.

EXAMPLE 22

The resin composition for semiconductor encapsulation prepared in Example 1 was previously defoamed at 70° C. in vacuo. Using this resin composition, a semiconductor device was produced in the following manner. A wiring circuit board having semiconductor elements mounted thereon was prepared in which the elements were electrically connected to the circuit board with bonding wires. The resin composition for semiconductor encapsulation heated to 70° C. was applied to the semiconductor elements which has been heated to 70° C., in a vacuum of 0.67 kPa by printing through openings formed in a mask. Subsequently, the ambient pressure was adjusted to 20 kPa to remove voids contained in the resin composition for semiconductor encapsulation thus applied. While maintaining the ambient pressure of 20 kPa, finish printing was conducted with the resin composition for semiconductor encapsulation heated to 70° C. Thereafter, the resin composition applied was cured by heating at 120° C. for 16 hours to form an encapsulating resin layer is which the semiconductor elements were encapsulated. Thus, a cavity fill type semiconductor device was produced.

EXAMPLE 23

The semiconductor device produced in Example 12 was placed on a mounting board (mother board) and electrically connected thereto, and this structure was heated to 100° C. Thereafter, the gap between the mounting board and the semiconductor device was filled by means of a dispenser with the resin composition for semiconductor encapsulation prepared in Example 1 which had been heated to 70° C. The resin composition applied was cured by heating at 120° C. for 16 hours to form an encapsulating resin layer in the gap between the semiconductor device and the mounting board. Thus, a semiconductor product was produced.

The encapsulating resin layer of each of the semiconductor devices and semiconductor product thus obtained was visually examined for the presence of bubbles therein. The results obtained are shown in Tables 3 to 5.

the protruding electrode portion side of a semiconductor wafer having a plurality of semiconductor elements with protruding electrode portion formed thereon which has been previously heated to a temperature of 70° C. through a dispenser to a thickness of 150 μm to form a resin layer. The resin composition thus applied was defoamed at a pressure of 0.67 kPa, and then thermoset at a temperature of 120° C. for 16 hours to form an encapsulating resin layer. Thereafter, the resin portion was polished in such a manner that the forward end of the protruding electrode portion was exposed to the exterior of the resin layer. The semiconductor wafer was then cut into pieces by a dicer to produce semiconductor devices (wafer level CSP).

EXAMPLE 25

The resin composition for semiconductor encapsulation prepared in Example 1 was previously defoamed at a temperature of 70° C. in vacuo. A semiconductor device (wafer level CSP) was then produced from the resin composition thus defoamed as follows. In some detail, the resin composition for semiconductor encapsulation was applied to the protruding electrode portion side of a semiconductor

TABLE 3

| | Example | | | | | | | | |
|---|---|---|---|---|---|---|---|---|---|
| | 5 | 6 | 7 | 8 | 9 | 10 | 11 | 12 | 13 |
| Presence of bubbles | slight | slight | slight | none | none | slight | slight | none | none |

TABLE 4

| | Example | | | | | | |
|---|---|---|---|---|---|---|---|
| | 14 | 15 | 16 | 17 | 18 | 19 | 20 |
| Presence of bubbles | slight | slight | none | none | medium | slight | medium |

TABLE 5

| | Example | | |
|---|---|---|---|
| | 21 | 22 | 23 |
| Presence of bubbles | slight | none | slight |

The results given in Tables 3 to 5 show that all the semiconductor devices and semiconductor product excluding the semiconductor devices in Examples 18 and 20 were satisfactory in that no or a slight amount of bubbles were observed in the encapsulating resin layer.

Examples of the process for the production of a semiconductor device comprising the resin composition for semiconductor encapsulation of the invention provided on a semiconductor wafer and a matrix wiring circuit board will be described hereinafter.

EXAMPLE 24

The resin composition for semiconductor encapsulation prepared in Example 1 was previously defoamed at a temperature of 70° C. in vacuo. A semiconductor device (wafer level CSP) was then produced from the resin composition thus defoamed as follows. In some detail, the resin composition for semiconductor encapsulation was applied to wafer having a plurality of semiconductor elements with protruding electrode portions formed thereon which had been previously heated to a temperature of 70° C. by printing through an opening in the mask at a pressure of 0.67 kPa to a thickness of 150 μm. The resin composition thus applied was defoamed in a vacuum of 0.67 kPa and then thermoset at a temperature of 120° C. for 16 hours to form an encapsulating resin layer. Thereafter, the resin portion was polished in such a manner that the forward end of each protruding electrode portion was exposed on the encapsulating resin layer. The semiconductor wafer was then cut into pieces by a dicer to produce semiconductor devices (wafer level CSP).

EXAMPLE 26

The resin composition for semiconductor encapsulation prepared in Example 1 was previously defoamed at a temperature of 70° C. in vacuo. A semiconductor device (wafer level CSP) was then produced from the resin composition thus defoamed as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing through an opening in the mask at a pressure of 0.67 kPa to a thickness of 150 μm. Thereafter, the pressure of the atmosphere was returned to 20 kPa where the resin composition was defoamed. Subsequently, the semiconductor wafer was subjected to finish printing at a pressure of 20 kPa. Thereafter, the resin composition thus applied was then thermoset at a temperature of 120° C. for 16 hours to form an encapsulating resin layer. Thereafter, the resin portion was polished in such a manner that the forward end of each protruding electrode portion was exposed on the encapsulating resin layer. The semiconductor wafer was then cut into pieces by a dicer to produce semiconductor devices (wafer level CSP).

EXAMPLE 27

A plurality of semiconductor elements were mounted on a matrix wiring circuit board having individual wiring circuits formed thereon with bonding wires. A semiconductor device (MAP-BGA process) was then produced from the resin composition for semiconductor encapsulation of Example 1 which had been defoamed at a temperature of 70° C. as follows. In some detail, the resin composition for semiconductor encapsulation was applied to the entire surface of semiconductor elements mounted on the matrix wiring circuit board which had been previously heated to a temperature of 70° C. through a dispenser to form a resin in such an arrangement that the semiconductor elements were encapsulated. The resin layer thus formed was then defoamed at a pressure of 0.67 kPa. The resin composition thus applied was then thermoset at a temperature of 120° C. for 16 hours to form an encapsulating resin layer. The matrix wiring circuit board was then cut into pieces by a dicer to produce semiconductor devices (MAP-BGA process).

EXAMPLE 28

A plurality of semiconductor elements were mounted through bonding wires on a matrix wiring circuit board having individual wiring circuits formed thereon. Using the resin composition for semiconductor encapsulating prepared in Example 1 which had been previously defoamed at 70° C. in vacuo, semiconductor devices (MAP-BGA process) were produced in the following manner. The resin composition for semiconductor encapsulating was applied to the entire surface of the semiconductor elements which were mounted on the matrix wiring circuit board and had been heated to 70° C., in a vacuum of 0.67 kPa by printing through an opening formed in a mask. The resin composition thus applied was then cured by heating at 120° C. for 16 hours to form an encapsulating resin layer. Thereafter, the matrix wiring circuit board was cut into pieces with a dicer to produce semiconductor devices (MAP-BGA process).

EXAMPLE 29

A plurality of semiconductor elements were mounted through bonding wires on a matrix wiring circuit board having individual wiring circuits formed thereon. Using the resin composition for semiconductor encapsulation prepared in Example 1 which had been previously defoamed at 70° C. in vacuo, semiconductor devices (MAP-BGA process) were produced in the following manner. The resin composition for semiconductor encapsulation was applied to the entire surface of the semiconductor elements which were mounted on the matrix wiring circuit board and had been heated to 70° C., in a vacuum of 0.67 kPa by printing through an opening formed in a mask. Subsequently, the ambient pressure was returned to 20 kPa to defoam the resin composition, and finish printing was further conducted in a vacuum of 20 kPa. The resin composition thus applied was then cured by heating at 120° C. for 16 hours to form an encapsulating resin layer. Thereafter, the matrix wiring circuit board was cut into pieces with a dicer to produce semiconductor devices (MAP-BGA process).

EXAMPLE 30

The resin composition for semiconductor encapsulation prepared in Example 1 was previously defoamed at a temperature of 70° C. in vacuo. A semiconductor device was then produced using the resin composition thus defoamed by flip chip mounting as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. through a dispenser to a thickness of 50 µm to form a resin layer. Thereafter, the semiconductor wafer was cut into pieces by a dicer. Subsequently, using a flip chip bonder, a wiring circuit board which had been previously heated to a temperature of 70° C. and the semiconductor elements thus separated were hot-pressed (conditions: 140° C.×20 N×60 min+220° C.×5 N×2 min) with the wiring circuit board and the resin layer side of the semiconductor elements being opposed to each other. In this manner, the semiconductor elements and the wiring circuit board were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE 31

The resin composition for semiconductor encapsulation prepared in Example 1 was previously defoamed at a temperature of 70° C. in vacuo. A semiconductor device was then produced from the resin composition thus defoamed by flip chip mounting as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing through an opening in the mask to a thickness of 50 µm. Thereafter, the semiconductor wafer was cut into pieces by a dicer. Subsequently, using a flip chip bonder, a wiring circuit board which had been previously heated to a temperature of 70° C. and the semiconductor elements thus separated were hot-pressed (conditions: 140° C.×20 N×60 min+220° C.×5 N×2 min) with the wiring circuit board and the resin layer side of the semiconductor elements being opposed to each other. In this manner, the semiconductor elements and the wiring circuit board were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE 32

The resin composition for semiconductor encapsulation prepared in Example 1 was previously defoamed at a temperature of 70° C. in vacuo. A semiconductor device was then produced from the resin composition thus defoamed by flip chip mounting as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing through an opening in the mask to a thickness of 50 µm. The resin composition thus applied was then defoamed at a pressure of 0.67 kPa. Thereafter, the semiconductor wafer was cut into pieces by a dicer. Subsequently, using a flip chip bonder, a wiring circuit board which had been previously heated to a temperature of 70° C. and the semiconductor elements thus separated were hot-pressed (conditions: 140° C.×20 N×60 min+220° C.×5 N×2 min) with the wiring circuit board and the resin layer side of the semiconductor elements being opposed to each other. In this manner, the semiconductor elements and the wiring circuit board were electrically connected to each other with the protruding electrode portion, and at the same time an encapsulating resin layer was formed in the gap between the wiring circuit board and the semiconductor elements. As a result, a semiconductor device was produced by flip chip mounting.

EXAMPLE 33

The resin composition for semiconductor encapsulation prepared in Example 1 was previously defoamed at a temperature of 70° C. in vacuo. A semiconductor device was then produced from the resin composition thus defoamed by flip chip mounting as follows. In some detail, the resin composition for semiconductor encapsulation was applied to the protruding electrode portion side of a semiconductor wafer having a plurality of semiconductor elements with protruding electrode portions formed thereon which had been previously heated to a temperature of 70° C. by printing at a pressure of 0.67 kPa through an opening in the mask to a thickness of 50 μm. Thereafter, the pressure of the atmosphere was returned to 20 kPa where the resin composition thus applied was then defoamed. Subsequently, the semiconductor wafer was subjected to finish printing at a pressure of 20 kPa. Thereafter, the semiconductor wafer was cut into pieces by a dicer. Subsequently, using a flip chip bonder, a wiring circuit board which had been previously heated to a temperature of 70° C. and the semiconductor elements thus separated were hot-pressed (conditions: 140° C.×20 N×60 min+220° C.×5 N×2 min) with the wiring circuit board and the resin layer side of the semiconductor elements being opposed to each other. In this manner, the semiconductor elements to each other with the protruding electrode portion, and at the same time, an encapsulating resin layer was formed in the gap between the wiring circuit board and the semiconductor elements. As a result, a semiconductor device was produced by flip chip mounting.

EXAMPLE 34

The resin composition for semiconductor encapsulation prepared in Example 1 was previously defoamed at a temperature of 70° C. in vacuo. A semiconductor device was then produced from the resin composition thus defoamed by flip chip mounting as follows. In some detail, the resin composition for semiconductor encapsulation was applied to the entire surface of a matrix wiring circuit board having individual wiring circuits formed thereon which had been previously heated to a temperature of 70° C. through a dispenser at a pressure of 0.67 kPa to form a resin layer. Thereafter, the matrix wiring circuit board was cut into pieces by a dicer. Subsequently, using a flip chip bonder, semiconductor elements each having a plurality of connecting electrode portions provided thereon and the wiring circuit boards thus separated were hot-pressed (conditions: 140° C.×20 N×60 min+220° C.×5 N×2 min) with the connecting electrode portion side of the semiconductor elements and the resin layer side of the wiring circuit boards being opposed to each other. In this manner, the semiconductor elements and the wiring circuit boards were electrically connected to each other with the protruding electrode portion, and at the same time, an encapsulating resin layer was formed in the gap between the wiring circuit board and the semiconductor element. As a result, a semiconductor device was produced by flip chip mounting.

EXAMPLE 35

The resin composition for semiconductor encapsulation prepared in Example 1 was previously defoamed at a temperature of 70° C. in vacuo. A semiconductor device was then produced from the resin composition thus defoamed by flip chip mounting as follows. In some detail, the resin composition for semiconductor encapsulation was applied to the entire surface of a matrix wiring circuit board having individual wiring circuits formed thereon which had been previously heated to a temperature of 70° C. by printing through an opening in the mask to form a resin layer. Thereafter, the matrix wiring circuit board was cut into pieces by a dicer. Subsequently, using a flip chip bonder, semiconductor elements each having a plurality of connecting electrode portions provided thereon and the wiring circuit boards thus separated were hot-pressed (conditions: 140° C.×20 N×60 min+220° C.×5 N×2 min) with the connecting electrode portion side of the semiconductor elements and the resin layer side of the wiring circuit boards being opposed to each other. In this manner, the semiconductor elements and the wiring circuit boards were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE 36

The resin composition for semiconductor encapsulation prepared in Example 1 was previously defoamed at a temperature of 70° C. in vacuo. A semiconductor device was then produced from the resin composition thus defoamed by flip chip mounting as follows. In some detail, the resin composition for semiconductor encapsulation was applied to the entire surface of a matrix wiring circuit board having individual wiring circuits formed thereon which had been previously heated to a temperature of 70° C. by printing through an opening in the mask to form a resin layer. The resin layer thus formed was then defoamed at a pressure of 0.67 kPa. Thereafter, the matrix wiring circuit board was cut into pieces by a dicer. Subsequently, using a flip chip bonder, semiconductor elements each having a plurality of connecting electrode portions provided thereon and the wiring circuit boards thus separated were hot-pressed (conditions: 140° C.×20 N×60 min+220° C.×5 N×2 min) with the connecting electrode portion side of the semiconductor elements and the resin layer side of the wiring circuit boards being opposed to each other. In this manner, the semiconductor elements and the wiring circuit boards were electrically connected to each other with the protruding electrode portion, and at the same time, an encapsulating resin layer was formed in the gap between the wiring circuit board and the semiconductor elements. As a result, a semiconductor device was produced by flip chip mounting.

EXAMPLE 37

The resin composition for semiconductor encapsulation prepared in Example 1 was previously defoamed at a temperature of 70° C. in vacuo. A semiconductor device was then produced from the resin composition thus defoamed by flip chip mounting as follows. In some detail, the resin composition for semiconductor encapsulation was applied to the entire surface of a matrix wiring circuit board having individual wiring circuits formed thereon which had been previously heated to a temperature of 70° C. by printing through an opening in the mask at a pressure of 0.67 kPa to form a resin layer. Thereafter, the pressure of the atmosphere was returned to 20 kPa where the resin composition thus applied was defoamed. Subsequently, the matrix wiring circuit board was subjected to finish printing at a pressure of 20 kPa. Thereafter, the matrix wiring circuit board was cut into pieces by a dicer. Subsequently, using a flip chip bonder, semiconductor elements each having a plurality of connecting electrode portions provided thereon and the wiring circuit boards thus separated were hot-pressed (conditions: 140° C.×20 N×60 min+220° C.×5 N×2 min) with the connecting electrode portion side of the semiconductor elements and the resin layer side of the wiring circuit boards being opposed to each other. In this manner, the semiconductor elements and the wiring circuit boards were electrically connected to each other with the protruding electrode portion, and at the same time, an encapsulating resin layer was formed in the gap between the wiring circuit boards and the semiconductor elements. As a result, a semiconductor device was produced by flip chip mounting.

The various semiconductor devices thus obtained were each then visually observed for the presence of bubbles in the encapsulating resin layer. The results are set forth in Tables 6 and 7 below.

TABLE 6

| | Example | | | | | | | | |
|---|---|---|---|---|---|---|---|---|---|
| | 24 | 25 | 26 | 27 | 28 | 29 | 30 | 31 | 32 |
| Presence of Bubbles | slight | slight | none | slight | slight | none | slight | slight | none |

TABLE 7

| | Example | | | | |
|---|---|---|---|---|---|
| | 33 | 34 | 35 | 36 | 37 |
| Presence of bubbles | none | none | slight | none | none |

The results given in Tables 6 and 7 show that the semiconductor devices were satisfactory in that no or a slight amount of bubbles were observed in the encapsulating resin layer.

As described above, the resin composition for semiconductor encapsulation of the invention comprises an epoxy resin (component A), an acid anhydride-based curing agent (component B), a latent curing accelerator (component C), and an inorganic filler (component D), and has a state and viscosity in a specific range at each of 25° C. and 80° C. Consequently, this resin composition for semiconductor encapsulation has a prolonged pot life and excellent storage stability as compared with conventional liquid encapsulating media. The resin composition for semiconductor encapsulation of the invention further has excellent dischargeability and applicability because the composition, although solid or semi-solid at room temperature, shows a rapid viscosity drop and thus can be liquefied at a temperature as low as about from 40 to 80° C. In particular, since the resin composition for semiconductor encapsulation of the invention is solid or semi-solid at ordinary temperature, the composition in an uncured state can be freely handled at ordinary temperature after applied to semiconductor elements or wiring circuit boards. Accordingly, this resin composition for semiconductor encapsulation can be used in such a manner that a semiconductor wafer or matrix wiring circuit board or the like is coated with the resin composition and then cut into individual elements and wiring circuit boards, and the elements are connected to the respective wiring circuit boards, for example, by thermocompression bonding with a flip chip bonder. Furthermore, since the resin composition for semiconductor encapsulation of the invention can be stored in a solid or semi-solid state at room temperature, the inorganic filler (component D) does not sediment. Accordingly, the resin composition for semiconductor encapsulation of the invention can be stored in a solid or semi-solid state and then liquefied at a low temperature according to need before use, making it possible to conduct satisfactory encapsulation. As a result, a semiconductor device having high reliability can be obtained.

The resin composition for semiconductor encapsulation of the invention is also advantageous in that it has an extremely prolonged pot life and exceedingly high storage stability when it contains as the latent curing accelerator (component C) a microcapsule type curing accelerator having a core-shell structure in which a core portion comprising a curing accelerator is covered by a specific shell portion.

Furthermore, the resin composition for semiconductor encapsulation of the invention is advantageous in that it has excellent flowability and hence excellent dischargeability and applicability when it contains as the inorganic filler (component D) a spherical fused silica powder in a specific proportion based thereon.

What is claimed is:

1. A resin composition for semiconductor encapsulation which comprises the following components (A) to (D) and which has a viscosity as measured at 25° C. of 700 Pa•s or higher or is solid at 25° C. and has a viscosity as measured at 80° C. of 500 Pa•s or lower:

(A) an epoxy resin;
(B) an acid anhydride-based curing agent;
(C) a latent curing accelerator; and
(D) an inorganic filler;

wherein said latent curing accelerator is a microcapsule curing accelerator having a core-shell structure comprising a core portion comprising a curing accelerator encapsulated with a shell portion mainly composed of a polymer having a structural unit represented by the following general formula (1):

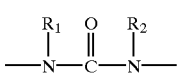

(1)

wherein $R_1$ and $R_2$, which may be the same or different, each represents a hydrogen atom or a monovalent organic group.

2. The resin composition for semiconductor encapsulation according to claim 1, wherein said epoxy resin as the component (A) is a crystalline epoxy resin.

3. The resin composition for semiconductor encapsulation according to claim 1, wherein said epoxy resin as the component (A) is a polyfunctional epoxy resin.

4. The resin composition for semiconductor encapsulation according to claim 1, wherein the shell portion of said microcapsule curing accelerator as the component (C) is one formed by reacting at least either of the following (X) and (Y) with an amine compound:

(X) an adduct of a tolylene diisocyanante with trimethylolpropane; and (Y) an adduct of a xylylene diisocyanante with trimethylolpropane.

5. The resin composition for semiconductor encapsulation according to claim 1, wherein said inorganic filler as the component (D) is a spherical fused silica powder and said spherical fused silica powder is incorporated in the resin composition for semiconductor encapsulation in a proportion of from 50 to 92% by weight based on the total amount of the resin composition for semiconductor encapsulation.

* * * * *